United States Patent [19]

Tahara et al.

[11] Patent Number: 5,356,515
[45] Date of Patent: Oct. 18, 1994

[54] DRY ETCHING METHOD

[75] Inventors: Yoshifumi Tahara, Machida; Yoshihisa Hirano, Kodaira; Masahiro Ogasawara, Hachioji; Isahiro Hasegawa, Zushi; Keiji Horioka, Kawasaki; Takaya Matsushita, Yokohama, all of Japan

[73] Assignees: Tokyo Electron Limited, Tokyo; Kabushiki Kaisha Toshiba, Kawasaki, both of Japan

[21] Appl. No.: 988,809

[22] Filed: Dec. 10, 1992

Related U.S. Application Data

[63] Continuation-in-part of Ser. No. 779,376, Oct. 18, 1991, Pat. No. 5,302,236.

[30] Foreign Application Priority Data

| Oct. 19, 1990 | [JP] | Japan | 2-283155 |
| Nov. 5, 1990 | [JP] | Japan | 2-300361 |
| Dec. 13, 1991 | [JP] | Japan | 3-352074 |
| Dec. 16, 1991 | [JP] | Japan | 3-331077 |

[51] Int. Cl.$^5$ .......................................... H01L 21/00
[52] U.S. Cl. ............................ 156/643; 156/646; 156/657; 156/345
[58] Field of Search ........... 156/643, 646, 657, 662, 156/345; 252/79.3, 79.4

[56] References Cited

U.S. PATENT DOCUMENTS

| 4,582,581 | 4/1986 | Flanigan et al. | 156/643 X |
| 5,147,500 | 9/1992 | Tachi et al. | 156/643 |

FOREIGN PATENT DOCUMENTS

| 174249 | 3/1986 | European Pat. Off. . |
| 283306 | 9/1988 | European Pat. Off. . |
| 158627 | 8/1985 | Japan . |
| 61-255027 | 11/1986 | Japan . |
| 63-141316 | 6/1988 | Japan . |
| 1-241126 | 9/1989 | Japan . |

*Primary Examiner*—Thi Dang
*Attorney, Agent, or Firm*—Oblon, Spivak, McClelland, Maier & Neustadt

[57] ABSTRACT

A dry etching method which includes supplying a workpiece having an oxide portion or a nitride portion into a processing vessel, keeping said workpiece at temperatures not higher than 0° C. within said processing vessel, supplying an etching gas including a first gas containing a halogen element and a second gas containing carbon having an oxidation number of less than 4 and oxygen to a region in the vicinity of the workpiece while keeping the temperature the workpiece at a level not higher than 0° C., and forming a plasma of said etching gas for etching the oxide portion or the nitride portion of the workpiece with said plasma.

10 Claims, 13 Drawing Sheets

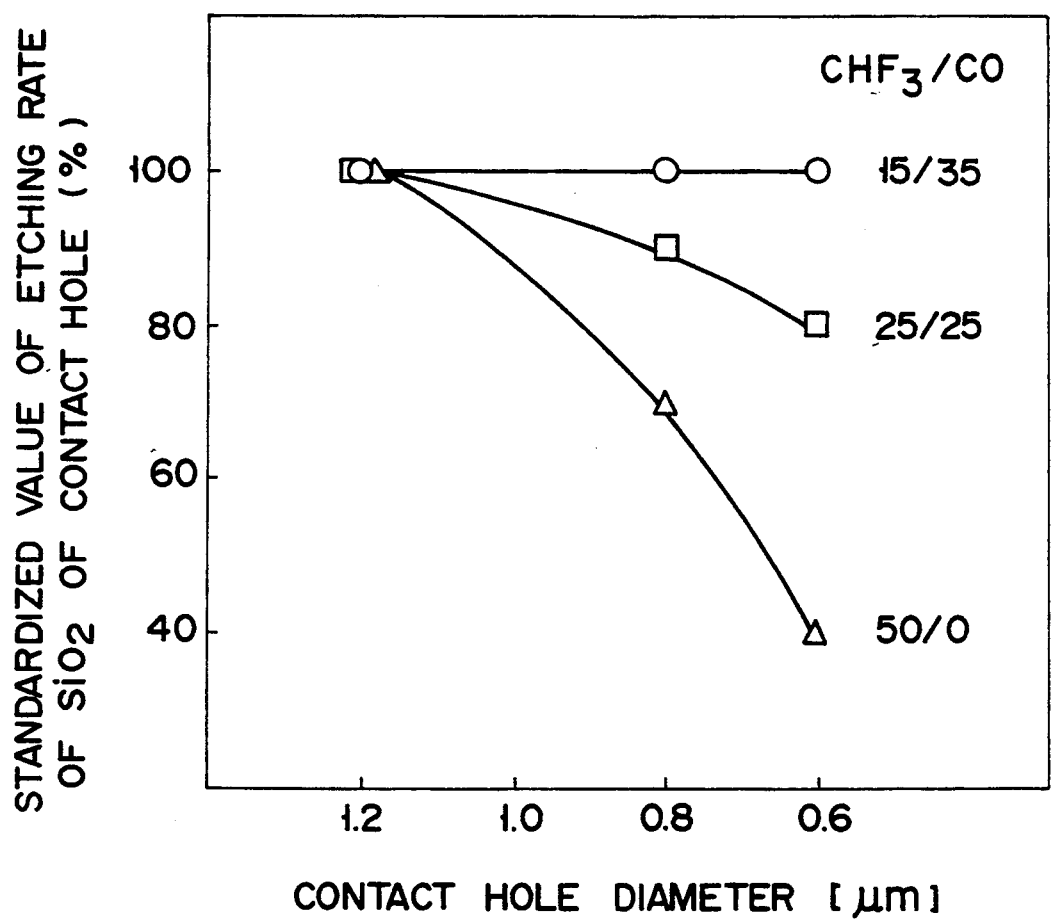
F I G. 9

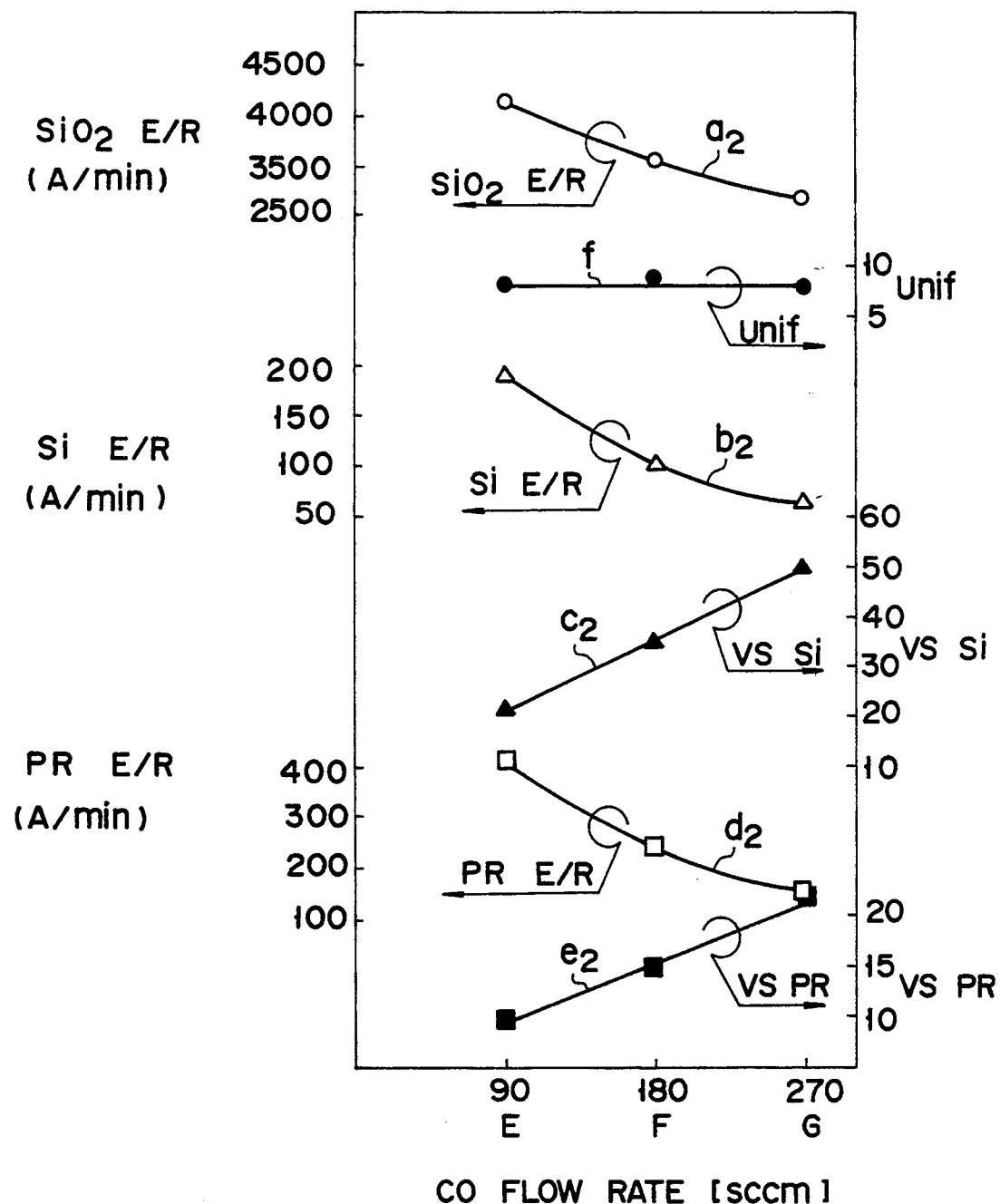
F I G. 10

| GAS RATIO | MEASUREMENT VALUE | CONTACT DIAMETER | | |
|---|---|---|---|---|
| | | 1.2 | 0.8 | 0.6 |
| A | $CHF_3/CO$ 50/0 E/R OF $SiO_2$ 3911 Å/M VS PR 5.1 VS Si 12.8 | | | |
| B | $CHF_3/CO$ 40/10 E/R OF $SiO_2$ 3576 Å/M VS PR 6.7 VS Si 13.1 | | | |
| C | $CHF_3/CO$ 25/25 E/R OF $SiO_2$ 2973 Å/M VS PR 8.5 VS Si 16.7 | | | |
| D | $CHF_3/CO$ 15/35 E/R OF $SiO_2$ 2545 Å/M VS PR 10.0 VS Si 22.9 | | | |

FIG. 11

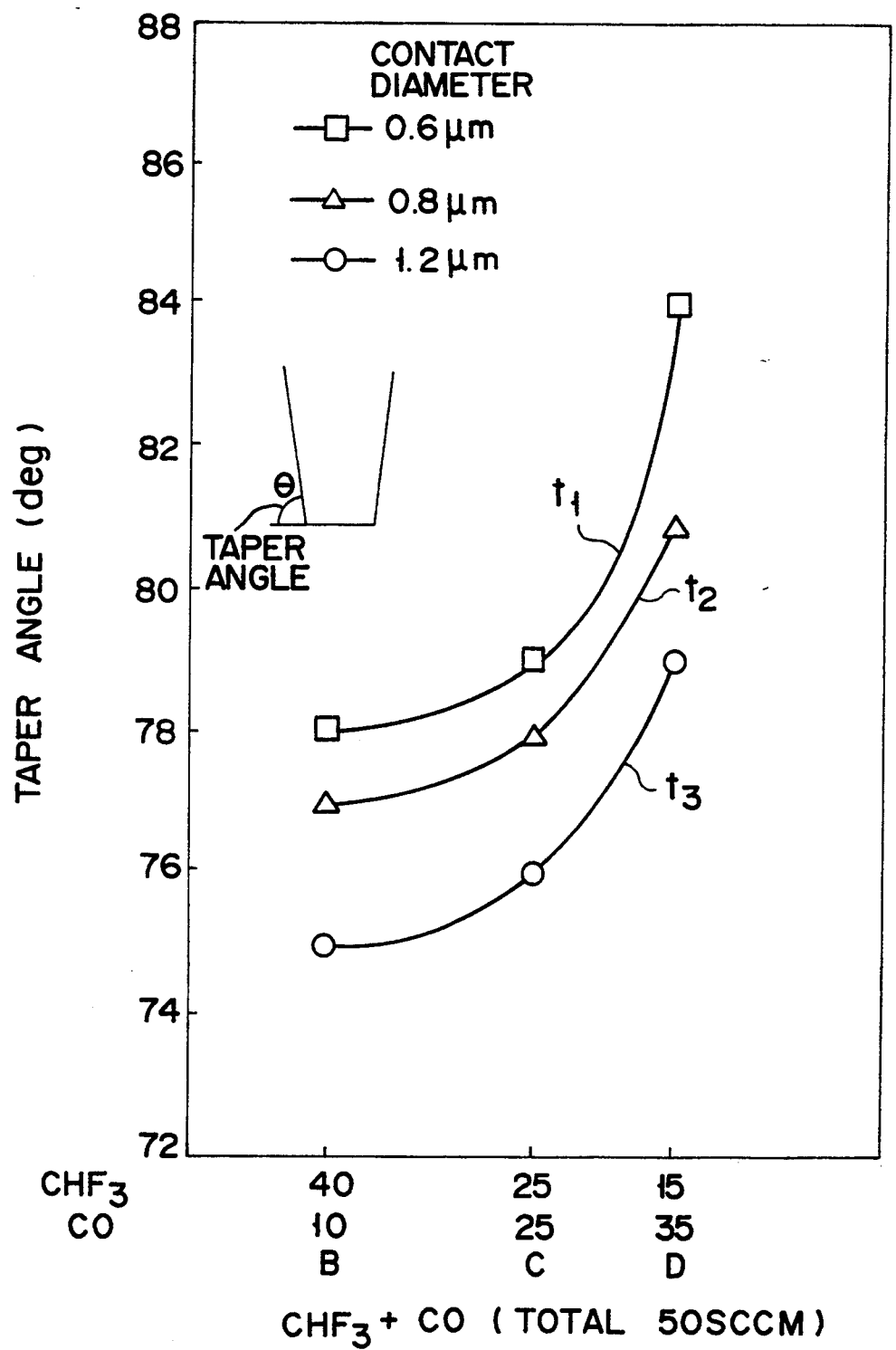
F I G. 12

DRY ETCHING METHOD

CROSS-REFERENCES TO THE RELATED APPLICATIONS

This application is a continuation-in-part of U.S. patent application Ser. No. 779,376, filed on Oct. 18, 1991, now U.S. Pat. No. 5,302,236.

BACKGROUND OF THE INVENTION

1. Field of the Invention

The present invention relates to a dry etching method for etching a predetermined portion of an object in the manufacture of, for example, a semiconductor device.

2. Description of the Related Art

The degree of integration in the integrated circuit included in a micro-electronic apparatus is being increased year by year. With increase in the integration degree, the pattern width in the integrated circuit has become smaller and smaller. Also, the pattern depth has become larger and larger. As a thin film processing technique capable of coping with the trend, a dry etching method under a high vacuum is disclosed in, for example, Published Unexamined Japanese Patent Application Nos. 61-256727 and 62-194623.

The dry etching method includes, for example, a plasma etching method, a sputter etching method, an ECR etching method, a magnetron etching method and a ion beam etching method. In the case of employing the dry etching method in the manufacture of a semiconductor element, the etching rate is increased by the use of a halogen-containing gas such as a Freon gas. Thus, the dry etching is employed in a reactive ion etching (RIE) method. The RIE method permits achieving an anisotropic etching while maintaining a high selectivity, i.e., ratio of the etching rate of a material to be etched to that of a photoresist, and also permits a high etching rate, leading to a high productivity.

Various ideas have been proposed in an attempt to improve the etching rate, etching selectivity, etc. in the dry etching method. For example, a method of improving the etching rate of silicon and silicon dioxide while suppressing the etching rate of a photoresist is disclosed in "1990 Symposium of Dry Process Session V-3 p 105–109". According to the method disclosed in this prior art, a fluorine-containing gas such as a $CHF_3$ gas is used as an etching gas, and the substrate temperature is set lower than 0° C. The particular method is highly effective in the case of etching a silicon film or simultaneously etching a silicon substrate and a silicon dioxide film.

On the other hand, a method of improving the etching rate of silicon while suppressing the etching rate of silicon dioxide and photoresist is disclosed in a monthly magazine "Semiconductor World, 1988, 1, page 58". In this prior art, $SF_6$ is used as an etching gas, and the substrate temperature is controlled at $-100°$ to $-130°$ C. during the etching treatment. The particular method is effective in the case of etching a silicon film and a silicon substrate alone without etching a silicon dioxide film.

However, any of the prior arts exemplified above gives rise to a serious problem in the case of etching, for example, a silicon dioxide film alone without etching a silicon substrate and photoresist, as follows.

Suppose an etching treatment is employed for forming contact holes in a semiconductor element comprising a silicon substrate, a silicon dioxide layer and a photoresist layer each formed on the substrate, diffusion layers formed within the substrate, and a poly-Si wiring formed within the silicon dioxide layer. In this case, the etching amount should be small in the region for exposing the surface of the poly-Si wiring, and should be large in the region for exposing the surface of the diffusion layer. It follows that, in order to form these contact holes simultaneously in a single etching treatment, it is necessary for the etching rate of poly-Si to be very low and for the etching rate of silicon dioxide to be very high. In other words, the etching selectivity, i.e., a ratio of the silicon dioxide etching rate to the poly-Si etching rate, is required to be very high. However, the etching selectivity of $SiO_2$ to poly-Si is at most about 13 in the conventional technique. This implies that the poly-Si wiring continues to be etched with an etching rate 1/13 time as high as that of $SiO_2$ even after formation of a contact hole to expose the poly-Si wiring.

A similar problem takes place also in the case where a $SiO_2$ film formed on a silicon substrate is overetched to ensure formation of a contact hole. Specifically, the silicon substrate is also etched during the over-etching step with an etching rate 1/13 time as high as the $SiO_2$ etching rate.

Recently, it is necessary to decrease the depth of a p-n junction layer formed below a contact hole with increase in the integration degree of, for example, an MOLSI element. As a result, a serious problem is taking place that the silicon substrate is etched during the over-etching step to collapse the p-n junction layer.

SUMMARY OF THE INVENTION

An object of the present invention, which has been achieved in view of the situation described above, is to provide a dry etching method which permits etching an oxide film or a nitride film included in a semiconductor element with a high etching rate and with a high etching selectivity with respect to silicon or photoresist.

According to the present invention, there is provided a dry etching method, comprising the steps of:

supplying a workpiece having an oxide portion or a nitride portion into a processing vessel;

keeping the workpiece at temperatures not higher than 0° C. within the processing vessel;

supplying an etching gas including a first gas containing a halogen element and a second gas containing a carbon having an oxidation number of less than 4 and an oxygen to a region in the vicinity of the workpiece while keeping the temperature of the workpiece at a level not higher than 0° C.; and forming a plasma of the etching gas for etching the oxide portion or the nitride portion of the workpiece with the plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a graph showing the micro loading effect, in which the flow rate ratio of $CHF_3$ gas to CO gas is used as a parameter;

FIG. 10 is a graph showing the etching rate of each of thin film layers, uniformity of etching of a silicon dioxide patterned layer, and the etching selectivity of the silicon dioxide patterned layer with respect to the silicon substrate and resist layer, covering the case where the dry etching method of the present invention is applied to a silicon wafer by using the apparatus shown in FIG. 1, in which the CO flow rate is changed while keeping constant the $CHF_3$ flow rate;

FIG. 11 shows the etching states in the case where the diameter of the contact hole is changed in each of the measuring points shown in FIG. 8;

FIG. 12 is a graph showing the taper angle in the case of carrying out the etching shown in FIG. 11;

DETAILED DESCRIPTION OF THE PREFERRED EMBODIMENTS

Figure 1:
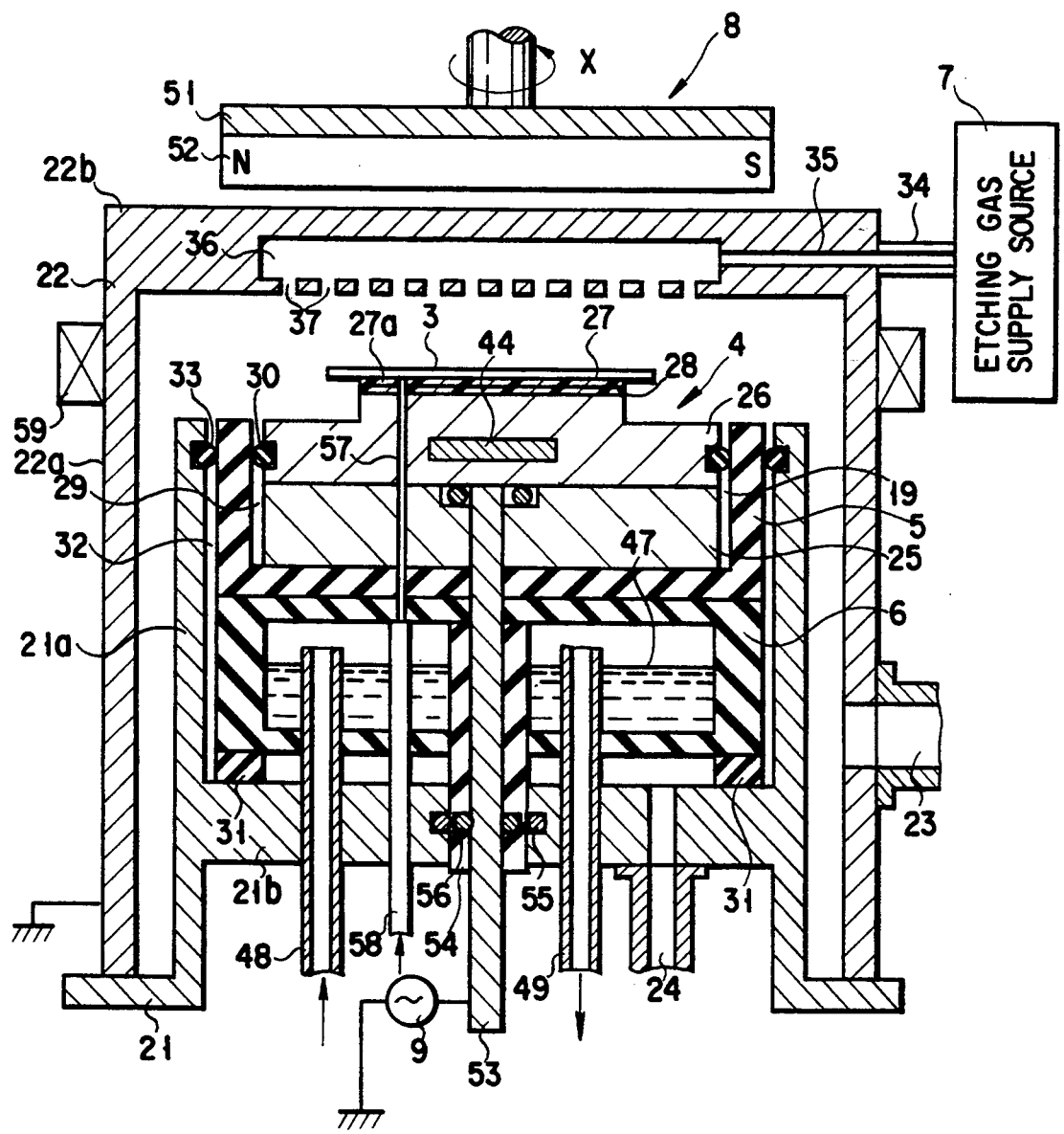
FIG. 1 schematically shows the construction of a dry etching apparatus used for working an etching method according to one embodiment of the present invention.

In the method of the present invention, an oxide portion or a nitride portion of a workpiece is etched by plasma of an etching gas including a first gas containing a halogen element and a second gas containing carbon (C) having an oxidation number of less than 4 and oxygen (O) while keeping the temperature of the workpiece at a level not higher than 0° C.

A typical example of the first gaseous compound having a halogen element, which is used in the present invention, is a Freon gas (registered trademark of Du Pont), which is a fluorocarbon gas such as $CHF_3$ gas. On the other hand, carbon monoxide (CO) gas is typically used in the present invention as the second gas containing C with an oxidation number of less than 4 and O. These first and second gases are introduced into a processing vessel, with the inner space of the vessel kept vacuum. Under this condition, a plasma of the etching gas is formed by application of a high frequency power supply (RF power supply). In this step, the workpiece disposed within the vessel is held at a temperature not higher than 0° C., and the oxide portion or the nitride portion of the workpiece are etched by the plasma of the etching gas.

The oxide portion or the nitride portion to be etched is present in the form of, for example, an oxide film or a nitride film including, for example, a single oxide film such as a $SiO_2$ film or a single nitride film such as a SiN film. The etching method of the present invention can also be applied to a laminated film of a $SiO_2$ film and a SiN film as well as to a SiON film. Further, an oxide or nitride of an element other than Si can also be etched by the method of the present invention. For example, the present invention is applicable to $Ta_2O_5$, $TiO_2$, TiN, etc. Still further, the present invention is applicable to the general silicate glasses containing additives such as phosphorus or boron.

As a first gas containing halogen element, fluorine-containing gases such as a Freon gas (fluorocarbon gas), for example, as $CHF_3$, $CBrF_3$ or $CF_4$, $SF_6$, $NF_3$ and $F_2$ can be used effectively in the method of the present invention. In addition, it is possible to use gaseous compounds having another halogen element such as chlorine (Cl), bromine (Br) or iodine (I). These gases can be used singly or in the form of a mixture. A satisfactory etching can be performed in the case of using a fluorocarbon which does not have a hydrogen atom such as $CF_4$, $C_2F_6$ or $C_3F_6$, or a mixed gas consisting of the hydrogen-free fluorocarbon exemplified above and a fluorocarbon having a hydrogen atom such as $CHF_3$ or $CH_2F_2$.

As described previously, a CO gas is suitably used as a second gas containing C having an oxidation number of less than 4 and O. It is also possible to use other gases such as HCOOH, HCHO, $CH_3COOH$ and $CH_3OH$. The second gas used in the present invention need not be restricted to those exemplified above. In some cases, it is possible to supply carbon and oxygen separately, as far as carbon having an oxidation number smaller than 4 is present together with oxygen. For example, a carbon film is formed on the inner surface of the processing vessel, and a gaseous carbon is formed by etching the carbon film. Further, oxygen is supplied to the vessel so as to achieve coexistence of carbon and oxygen.

In the case of supplying a $CO_2$ gas, in which the carbon has an oxidation number of 4, the verticality (anisotropy) can certainly be improved. However, since the etching selectivity is lowered, it is not desirable to use a $CO_2$ gas.

The etching gas can be diluted with, for example, an argon gas. Further, it is possible for the etching gas to contain another gas such as a hydrogen gas.

A suitable etching gas can be provided by, for example, the combination of $CHF_3$ gas and CO gas as pointed out previously and by the combination of a mixed gas of $CHF_3$ and $CF_4$ and a second gaseous compound of CO.

When a gas containing C having an oxidation number of less than 4 and O are present in a plasma atmosphere, free radicals generated by decomposing a gas containing a halogen element are reduced, and a reaction for producing C may occur. That is, for example, when etching is performed using $CHF_3$ as the halogen element and using CO gas as a gas containing C having an oxidation number of less than 4 and O, it is deduced that $CF_2$ radicals produced by decomposing the $CHF_3$ in a plasma and added CO molecules are chemically reacted in the following reaction formula:

$$CF_2 + CO \rightarrow COF_2 + C$$

It is known that the $CF_2$ radicals are reactively polymerized to each other to form a fluorocarbon polymer, and that this polymer is easily deposited on the bottoms of small holes or on side walls thereof. Therefore, when $CF_2$ is reduced according to the above reaction, deposition of a polymer film is suppressed. As a result, verticality (anisotropy) of the etching is improved, and a microloading effect is suppressed.

A C film is formed on the exposed surface of a substrate by C produced by the above reaction, the substrate surface is protected, and etching of the substrate is suppressed. On an oxide film, since O produced by the etching reaction is bonded to C to produce CO or $CO_2$ gas, deposition of C is suppressed, and etching is rapidly performed. As a result, an etching selection ratio of the oxide film to the substrate is increased. Moreover, the C does not adversely affect the suppression of the microloading effect.

In the present invention, it is important to keep the temperature of the workpiece at a level not higher than 0° C. during the etching treatment in order to markedly improve the etching rate of the oxide film or nitride film.

To reiterate, the etching gas used in the present invention including a first gas containing a halogen element and a second gas containing carbon having an oxidation number of less than 4 and oxygen. In addition, the temperature of the workpiece during the etching treatment is set at a level not higher than 0° C. These particular conditions permit etching an oxide film or a nitride film included in a semiconductor element with a high etching rate and with a high etching selectivity with respect to silicon or photoresist. In addition, a satisfactory etching anisotropy can be achieved so as to suppress substantially completely the micro loading effect, i.e., the effect that the etching depth is diminished with decrease in the diameter of the etching region.

In the case of using an etching gas containing a Freon gas such as $CHF_3$ and CO, it is desirable to set the amount of the CO gas larger than that of the Freon gas in order to achieve a sufficiently high etching selectivity.

Let us describe a dry etching method according to embodiments of the present invention with reference to the accompanying drawings.

FIG. 1 schematically shows the construction of a magnetron plasma etching apparatus 10 used in this embodiment. As seen from the drawing, the etching apparatus 10 comprises a vacuum chamber 1, a supporting table (susceptor) 4 disposed within the vacuum chamber 1 for supporting a workpiece 3 such as a semiconductor wafer, a supporting table accommodating section 5 made of an electrically insulating ceramic material, a liquid nitrogen containing section 6 positioned below the accommodating section 5, an etching gas supply source 7 for introducing an etching gas into the vacuum chamber 1, a magnet section 8 positioned above the vacuum chamber 1, and an RF power supply 9 connected to the supporting table 4.

The vacuum chamber 1 comprises a lower chamber 21 and an upper chamber 22. The lower chamber 21 is defined by a side wall portion of the supporting table accommodating section 5, a side wall 21a covering a side wall portion of the liquid nitrogen containing section 6, and a bottom wall 21b supporting the accommodating sections 5 and 6. On the other hand, the upper chamber 22 is defined by a side wall 22a formed in a cylindrical form to cover the side wall 21a of the lower chamber 21 and an upper wall 21b functioning as an upper electrode. An outlet port 23 is formed in a lower portion of the side wall 22a of the upper chamber 22. A discharge means such as a vacuum pump (not shown) is connected to the outlet port 23. The inner pressure of the chamber 1 can be reduced to about $10^{-6}$ Torr by operating the discharge means. On the other hand, an outlet port 24 is formed in the bottom wall 21b of the lower chamber 21. Another discharge means (not shown) is connected to the outlet port 24.

A disk-shaped space 36 is provided within the upper wall 22b of the upper chamber 22 in a manner to face the supporting table 4. A large number of gas diffusion holes 37 are formed to permit communication between the space 36 and the inner region of the vacuum chamber 1. An etching gas is supplied from the etching gas supply source 7 into the space 36 via a gas conduit pipe 34 and a gas inlet hole 35 and, then, into a plasma-forming region within the vacuum chamber 1 via the diffusion holes 37. It is possible to provide a heating means, if necessary, for heating the etching gas to a temperature higher than room temperature. Of course, the heating means should be disposed to heat the etching gas supplied from the etching gas supply source 7.

The supporting table 4 comprises a lower member 25 and an upper member 26 detachably mounted to the lower member 25. A disk-shaped projection 26a is formed in the central portion of the upper member 26. An electrostatic attracting sheet 27 is disposed on the projection 26a. A wafer 3 is fixed by coulomb force to the projection 26a with the electrostatic attracting sheet 27 interposed therebetween. The electrostatic attracting sheet 27 comprises an insulating sheet 27a made of, for example, polyimide and a conductive sheet 28 made of copper and buried in the insulating sheet 27a. The conductive sheet 28 is connected to a DC power supply (not shown).

The liquid nitrogen containing section 6 is positioned above the bottom wall 21b of the lower chamber 21 with an annular member 31, which is made of an electrically insulating ceramic material, interposed therebetween. The wafer 3, i.e., the workpiece, is cooled by liquid nitrogen 47 contained in the containing section 6. An inlet pipe 48 and a discharge pipe 49 are inserted into the liquid nitrogen housing section 6. Liquid nitrogen is introduced through the inlet pipe 48 into the containing section 6. On the other hand, an overflowing liquid nitrogen is discharged through the discharge pipe 49. The inner surface of the bottom wall of the liquid nitrogen containing section 6 is formed porous to permit a nucleate boiling, with the result that the inner surface of the bottom wall can be maintained at about −196° C. A cooling gas such as a He gas of a predetermined pressure is circulated through a gas pipe (not shown) extending from the liquid nitrogen containing section 6 to reach the upper member 26 so as to improve the cooling efficiency of the workpiece 3 with liquid nitrogen.

A heater 43 is disposed within the upper member 26 of the supporting table 4 for heating the workpiece 3. It should be noted that liquid nitrogen 47 and the heater 43 are used in combination to control the temperature of the workpiece 3 at a desired level not higher than 0° C.

The side surface and bottom surface of the supporting table 4 are covered with the supporting table accommodating section 5. A space 29 is defined between the inner surface of the side wall of the housing section 5 and the supporting table 4. The upper end of the space 29 is sealed by an O-ring 30. Likewise, a space 32 is defined by the inner surface of the side wall 21a of the lower chamber 21, the supporting table accommodating section 5, and the liquid nitrogen containing section 6. The upper end of the space 32 is sealed by an O-ring 33. Further, holes are formed in the supporting table accommodating section 5 and the annular member 31 to permit the spaces 29 and 32 to communicate with the outlet port 24. Naturally, these spaces 29 and 32 can be evacuated by the discharge means. It follows that these O-rings 30 and 33 serve to allow the spaces 29 and 32, respectively, to form vacuum heat insulating layers.

The RF power source 9 is connected to the upper member 26 of the supporting table 4 functioning as a lower electrode via a conductive rod 53. An insulating cylindrical member 54 into which the conductive rod 53 is inserted extends through the bottom wall 21b and the bottom wall of the liquid nitrogen containing section 6 to reach the inner surface of the upper wall of the section 6. An O-ring 55 is provided between the cylindrical member 54 and the bottom wall 21b. Likewise, an O-ring 56 is provided between the cylindrical member 54 and the rod 53.

The upper wall 22b functioning as an upper electrode is connected to the ground. It should be noted that a pair of parallel plate electrodes are formed by the upper wall 22b and the supporting table 4 connected to the RF power source 9 and functioning as a lower electrode. It follows that a high frequency electric field is formed between the upper wall 22b and the supporting table 4.

The magnet section 8 comprises a supporting member 51 horizontally disposed right above the vacuum chamber 1, a permanent magnet 52 supported by the supporting member 51, and a motor (not shown) for rotating the supporting member 51 and the permanent magnet 51 in a direction denoted by an arrow X in the drawing. A uniform parallel magnetic field is formed above the surface of the workpiece 3 by the magnet section 8 of the particular construction. It follows that formed is a crossed electromagnetic field consisting of the high frequency electric field formed between the upper wall 22b and the supporting table 4 and the parallel magnetic field noted above, making it possible to achieve a magnetron discharge.

A gas hole 57 is formed to extend through the upper member 26, the lower member 25, the bottom wall of the supporting table accommodating section 5 and the upper wall of the liquid nitrogen containing section 6. Also, a pipe 58 communicating with the gas hole 57 extends downward through the bottom wall 21b of the lower chamber 21. A heat transfer gas is supplied from a supply source (not shown) into the clearance between the upper member 26 and the workpiece 3 through the pipe 58 and the gas hole 57. The heat transfer gas thus supplied permits improving the heat transfer between the supporting table 4 and the workpiece 3 so as to control very accurately the temperature of the workpiece 3. In view of the object described above, a gas having a high heat conductivity should desirably be used as the heat transfer gas. It is also important for the heat transfer gas not to adversely affect the etching reaction. In view of these conditions, it is desirable to use He, $O_2$, Ar or $N_2$ as the heat transfer gas. It is particularly desirable to use a helium gas. The magnetron plasma etching apparatus shown in the drawing also comprises a heater 59 for heating the vacuum chamber 1.

In performing an etching treatment by using the apparatus of the construction described above, the workpiece 3, e.g., a semiconductor wafer, is loaded from a load lock chamber (not shown) disposed adjacent to the vacuum chamber 1 into the vacuum chamber 1 and disposed on the electrostatic attracting sheet 27. Then, a DC voltage of 2 kV is applied to the conductive sheet 28. Under this condition, the inner space of the vacuum chamber 1 is evacuated into a vacuum of $10^{-2}$ to $10^{-3}$ Torr order. Then, an etching gas is supplied from the etching gas supply source 7 into the plasma forming region within the vacuum chamber 1 through the gas conduit pipe 34, the gas inlet hole 35, the space 36 and the diffusion hole 37. Under this condition, a high frequency power is supplied from the RF power source 9 to provide a high frequency voltage between the upper wall 22b functioning as the upper electrode and the supporting table 4 functioning as the lower electrode. In this step, a parallel magnetic field is applied between these electrodes from the magnet 52. It follows that a crossed electromagnetic field is formed above the surface of the workpiece 3 to cause the magnetron discharge to excite the surface of the workpiece 3. Since the magnet 52 is kept rotated, the magnetron discharge permits uniformly exciting the surface of the workpiece 3. During the magnetron discharge, electrons present between the two electrodes perform cyclone motions so as to increase the number of collisions of the electrons against molecules so as to ionize the molecules. As a result, such a high etching rate as 1 $\mu$m/min can be achieved under a relatively low pressure of $10^{-2}$ to $10^{-3}$ Torr order. The discharge also permits a vertical etching in addition to the etching under such a low pressure. It should be noted that a coulomb force is generated within the electrostatic suction sheet 27 by the plasma generation noted above, with the result that the workpiece 3 is fixed to the sheet 27.

During the etching treatment performed by the magnetron discharge, the temperature of the workpiece 3 is kept at a predetermined level not higher than 0° C. by the liquid nitrogen within the liquid nitrogen containing section 6, making it possible to further improve the etching rate.

What should also be noted is that the etching gas used including a first gas containing a halogen element and a second gas containing C having an oxidation number of less than 4 and 0. The particular etching gas permits markedly improving the etching selectivity. As described previously, it is desirable to use an etching gas containing $CHF_3$ as the first gaseous compound and CO as the second gaseous compound. Further, it is possible to allow the etching gas to contain an additional gas such as a hydrogen gas.

Figure 2:
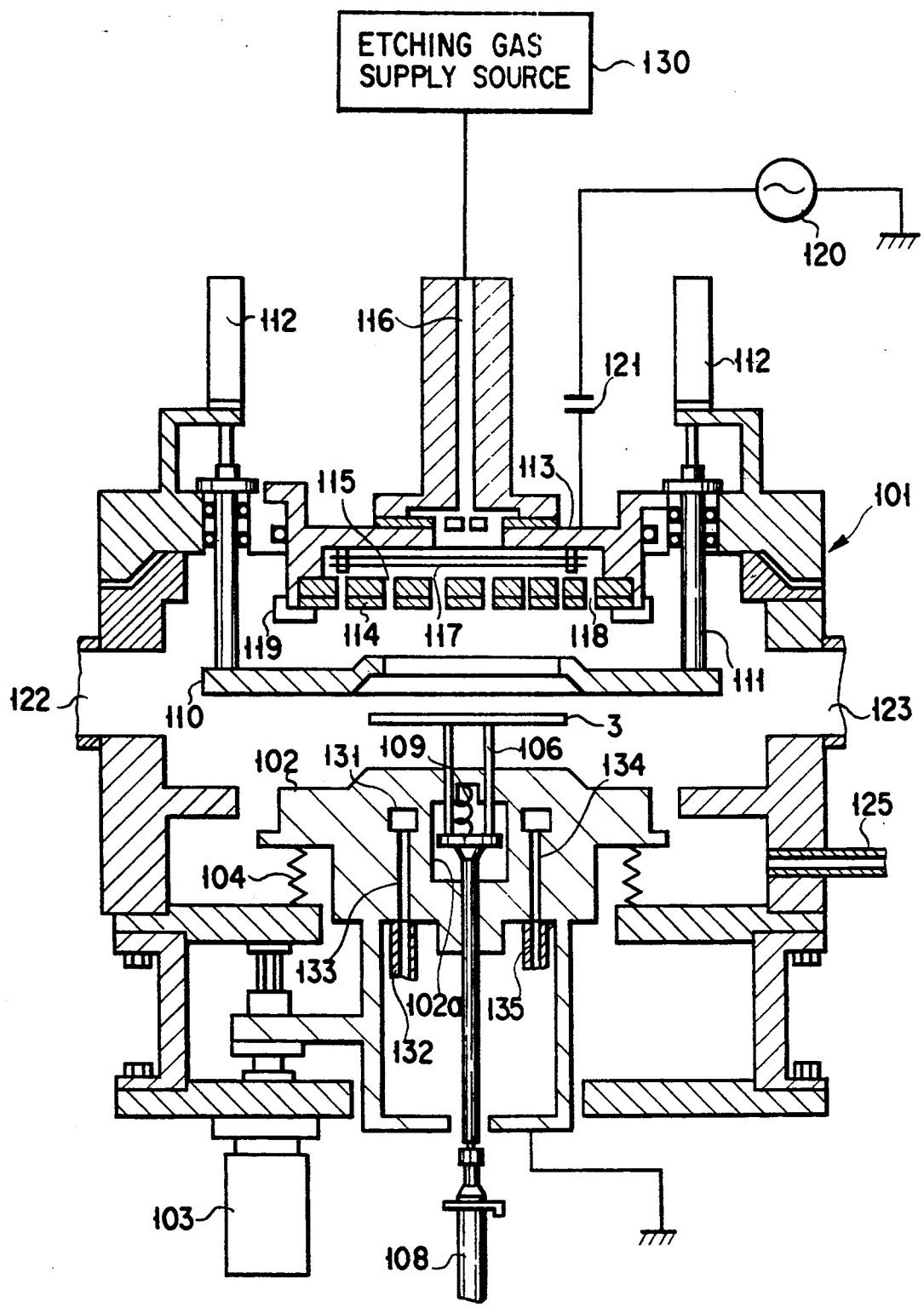
FIG. 2 schematically shows the construction of a dry etching apparatus used for working an etching method according to another embodiment of the present invention.

In the embodiment described above, a magnetron plasma etching apparatus is used for working the dry etching method of the present invention. In addition, an etching apparatus using parallel plate electrodes and not using a magnetron can also be used for working the method of the present invention. FIG. 2 exemplifies the etching apparatus using parallel plate electrodes.

As seen from the drawing, the apparatus comprises a vacuum chamber 101. A lower electrode 102 formed of, for example, an aluminum plate having an anodic oxidation treatment applied to the surface thereof is disposed in a lower portion of the vacuum chamber 101. An upwardly projecting mounting portion having a trapezoid cross section is formed in the central portion of the lower electrode 102. A workpiece such as a semiconductor wafer 3 is disposed on the mounting portion. It is desirable to cover the electrode 102 except the mounting portion with an insulating material, e.g., Teflon (trademark). In this case, the insulating material permits improving the focus effect that the discharge is concentrated on the wafer 3.

The lower electrode 102 can be moved up and down by a lift 13 over a maximum stroke of, for example, 30 mm. when the lower electrode 102 is moved up and down, the vacuum chamber 101 is kept hermetic by bellows 104 made of, for example, a stainless steel.

A space 102a is formed in the central portion of the lower electrode 102. A plurality of lifter pins 106, e.g., four lifter pins, made of, for example, a stainless steel, are inserted into a plurality of through holes, e.g., four through holes, extending upward from the space 102a. Each of these lifter pins 106 is connected to a lift mechanism 108 via a plate 107. The lifter pin 106 is moved upward by driving the lift mechanism 108 so as to move the workpiece 3 away from the lower electrode 102 and, thus, the workpiece 3 is made ready for transference. When the lifter pin 106 is moved downward, the workpiece 3 is disposed on the lower electrode 102. The lower electrode 102 is connected to the plate 107 via a coil spring 109 to moderate the movement of the lifter pin 106.

A coolant passageway 131 is formed within the lower electrode 102. A coolant, for example, liquid nitrogen, is supplied from a coolant supply source (not shown) into the coolant passageway 131 via a coolant supply pipe 132 and a coolant supply hole 133. The workpiece 3 disposed on the lower electrode 102 is kept at a predetermined temperature not higher than 0° C. by the coolant. The coolant within the coolant passageway 131 is discharged to the outside through a coolant discharge hole 134 and a coolant discharge pipe 135.

A clamp ring 110 is disposed above the lower electrode 102. The clamp ring 110 serves to uniformly press the workpiece 3 against the surface of the lower electrode 102 for fixing the workpiece 3. Thus, the central portion of the clamp ring 110 is shaped to conform with the mounting portion of the lower electrode 102. The clamp ring 110 is made of a material which does not affect plasma such as aluminum having the surface subjected to an anodic oxidation treatment, quartz or a ceramic material such as alumina. The clamp ring 110 is supported by a plurality of shafts 111, e.g., four shafts, hermetically extending downward from above the chamber 101. Each of these shafts 111 is independently connected to a driving mechanism, e.g., an air cylinder 112, to allow the clamp ring 110 to be moved up and down. If the lower electrode 102 having the workpiece 3 disposed thereon is moved upward, the workpiece 3 is allowed to abut against the clamp ring 110. If the lower electrode 102 is further moved upward, the depressing force of the air cylinder 112 causes the clamp ring 110 to clamp the workpiece 3. The clamp ring 110 can be further moved upward by a predetermined distance, e.g., 5 mm, by controlling the driving of the air cylinder 112 to maintain a required depressing force.

A conductive member 113 made of a conductive material, e.g., aluminum having the surface subjected to an anodic oxidation treatment, is provided at the top portion of the chamber 101. An upper electrode 114 electrically connected to the conductive member 113 is disposed slightly apart from the conductive member 113. Specifically, a space 115 is provided between the upper electrode 114 and the conductive member 113. The upper electrode 114 is made of, for example, amorphous carbon, aluminum, or aluminum having the surface subjected to an anodic oxidation treatment.

A gas supply pipe 116 communicates with the space 115. An etching gas is supplied from an etching gas supply source 130 disposed outside the chamber 101 into the space 115 through the gas supply pipe 116. As described previously, the etching gas includes a first gas containing a halogen element and a second gas containing C having an oxidation number of less than 4 and O.

A plurality of baffles 117 each having a plurality of apertures are disposed within the space 115 to permit a uniform diffusion of the etching gas. Of course, the upper electrode 114 is provided with a plurality of holes 118 to allow the gas diffused by the baffles 117 to flow into the chamber 101.

A shield ring 119 made of an insulating material such as Teflon (trademark) is provided to surround the periphery of the upper electrode 114, making it possible to generate plasma in a region substantially equal in diameter to the workpiece 3.

The upper electrode 114 is connected to a high frequency power supply 120 via a capacitor 121 and the conductive member 113. On the other hand, the lower electrode 102 is connected to the ground. A plasma of the etching gas is generated between these upper and lower electrodes upon application of a high frequency voltage to the upper electrode 114. In this case, the apparatus is set at a plasma mode for performing a radical etching.

The apparatus can also be set at a reactive ion etching (RIE) mode by connecting the upper electrode 114 to the ground, while supplying a high voltage to the lower electrode 102. It is also possible to supply an RF power differing in phase by 180° C. between the upper and lower electrodes.

A gas outlet port 125 is formed in a lower portion of the side wall of the vacuum chamber 101. The inner space of the chamber 101 is evacuated by a vacuum pump (not shown) through the outlet port 125. Further, a workpiece inlet port 122 and a workpiece outlet port 123 are formed to face each other in the side walls of the chamber 101. Of course, the workpiece is put into the chamber 101 through the inlet port 122 and is taken out of the chamber 101 through the outlet port 123.

In performing a plasma etching treatment by using the apparatus shown in FIG. 2, a workpiece is taken out by a sender (not shown) and put in a load lock chamber (not shown) for transferring the workpiece. The gate on the inlet side within the load lock chamber is closed to evacuate the load lock chamber. Then, the inlet port 122 is opened to transfer the workpiece 3 above the lower electrode 102 by using a transfer mechanism (not shown). The lifter pins 106 are moved upward to receive the workpiece at the upper ends, followed by withdrawing the transfer mechanism. Under this condition, the chamber 101 is kept hermetic. Then, the lifter pins 106 are moved downward to dispose the workpiece 3 on the lower electrode 102. Further, the lower electrode 102 is moved upward to permit the periphery of the workpiece 3 to abut against the clamp ring 110, with the result that the workpiece 3 is fixed by the clamp ring 110.

In the next step, the chamber 101 is evacuated, followed by introducing the etching gas at a predetermined flow rate from the gas supply source 130 into the chamber through the gas supply pipe 116 so as to set the pressure within the chamber at a predetermined level, e.g., not higher than 1 Torr. Under this condition, an RF power is supplied between the upper electrode 114 and the lower electrode 102 so as to generate plasma of the etching gas between these upper and lower electrodes and, thus, to etch the workpiece 3. During the etching treatment, a coolant such as liquid nitrogen is circulated through the coolant passageway 131 so as to keep the temperature of the workpiece at a level not higher than 0° C. In this embodiment, the etching can be carried out with a high etching rate and a high etching selectivity because of the cooling of the workpiece and the composition of the etching gas specified in the present invention.

After the etching treatment, the lower electrode 102 is moved downward and the lifter pins 106 are moved upward while evacuating the chamber 101 so as to permit the workpiece 3 to be supported by the upper ends of the pins 106. Then, the workpiece 3 is taken out of the apparatus by a load lock chamber (not shown) for transferring the workpiece, which is driven by a transfer mechanism (not shown).

In any of the apparatuses shown in FIGS. 1 and 2, it is desirable for the amount of the second gas containing C having an oxidation number of less than 4 and O to be relatively larger than that in the peripheral region of the workpiece 3. The present inventors have conducted an experiment in which an etching gas containing a $CHF_3$ gas as the first gas and a CO gas as the second gas was used for etching a semiconductor wafer. It has been found that, where an etching gas is uniformly supplied, the etching selectivity of $SiO_2$ to Si in the central portion of the wafer markedly differs from that in the peripheral portion. Specifically, the etching selectivity in the central portion has been found higher than in the peripheral portion. It is considered reasonable to understand that a gas stream flowing from the central portion toward the peripheral portion is formed in the plasma region because of, for example, the location of the outlet port of the vacuum chamber, leading to a low etching selectivity in the peripheral portion of the wafer. The etching selectivity in the peripheral portion can be made substantially equal to that in the central portion by allowing the amount of the second gas of the etching gas to be relatively larger in the peripheral portion than in the central portion of the workpiece 3, as described above.

Figure 3:
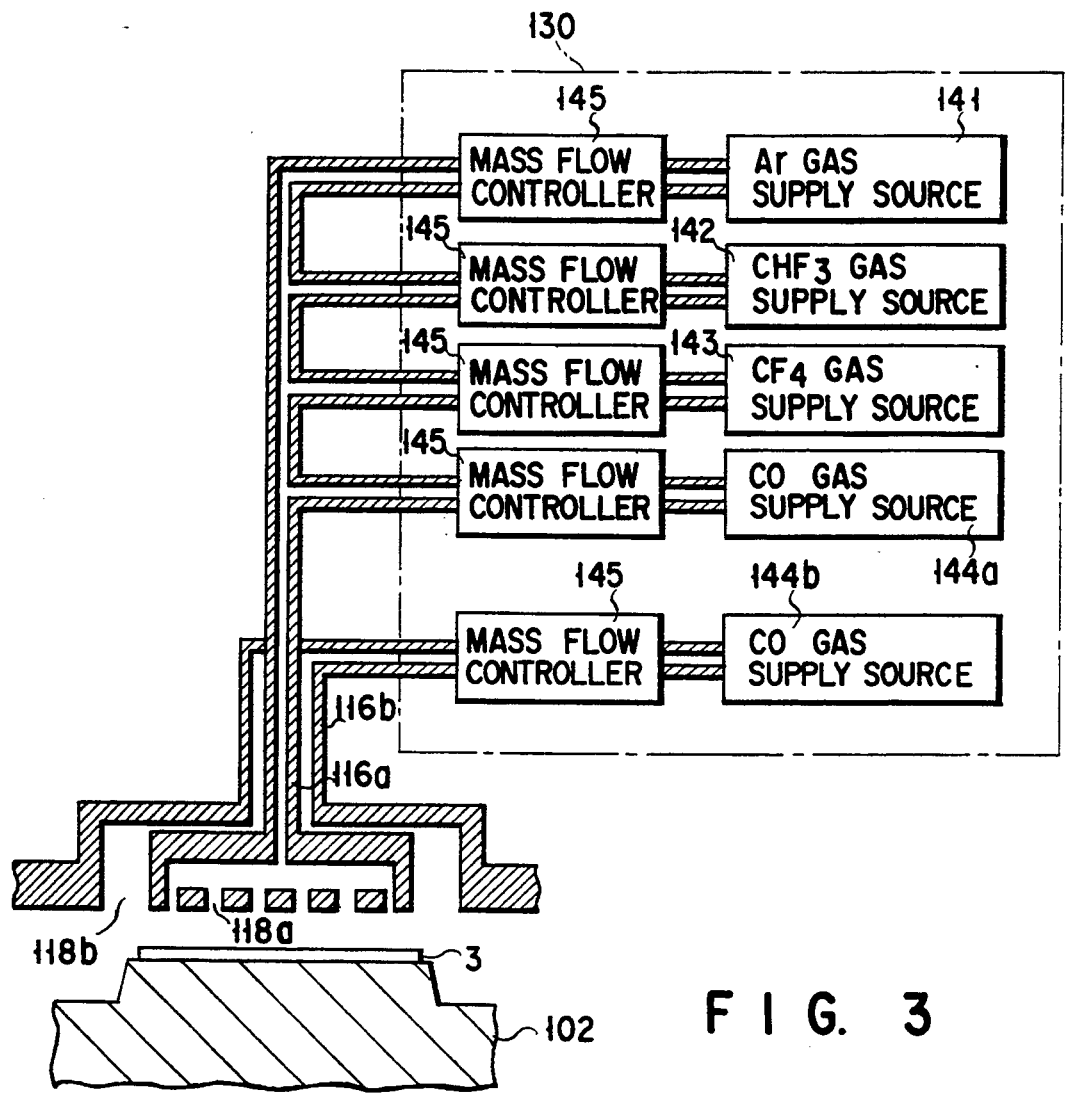
FIGS. 3 and 4 show modifications of the etching gas supply system included in the dry etching apparatus used for working the method of the present invention.

FIG. 3 shows a gas supply system which permits the amount of the second gaseous compound, e.g., a CO gas, in the peripheral portion to be relatively larger than in the central portion of the workpiece. In this embodiment, the system of FIG. 3 is used in the apparatus shown in FIG. 2. The etching gas used in this embodiment contains a $CHF_3$ gas, a $CF_4$ gas, a CO gas and an Ar gas. The gas supply source 130 comprises an Ar gas supply section 141, a $CHF_3$ gas supply section 142, a $CF_4$ gas supply section 143, and CO gas supply sections 144a and 144b. The gases supplied from the supply sections 141, 142, 143 and 144a are combined to form a mixed gas, which is supplied to the central portion of the workpiece 3 through a gas supply pipe 116a and a hole 118a. On the other hand, the CO gas supplied from the supply section 144b is supplied to the peripheral portion of the workpiece 3 through a gas supply pipe 116b coaxially formed to surround the gas supply pipe 116a and a hole 118b formed outside the hole 118a. It follows that the amount of the CO gas supplied to the peripheral portion of the workpiece 3 can be made larger than in the central portion. As shown in FIG. 3, a mass flow controller 145 is connected to each of the gas supply sections.

Figure 4:
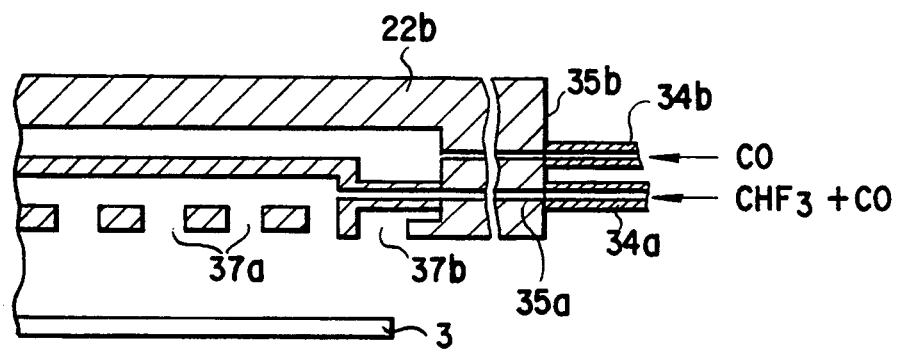

FIG. 4 exemplifies another type of the gas supply system, which can be used in the apparatus shown in FIG. 1. In this embodiment, a mixed gas of, for example, a $CHF_3$ gas and a CO gas is supplied to the central portion of the workpiece 3 through a gas supply pipe 34a, a gas supply hole 35a and a hole 37a. Further, a CO gas is supplied to the peripheral portion of the workpiece 3 through a gas supply pipe 34b, a gas supply hole 35b and a hole 37b. Clearly, the system shown in FIG. 4 permits making the amount of the CO gas supplied to the peripheral portion larger than that supplied to the central portion.

Figure 5A:
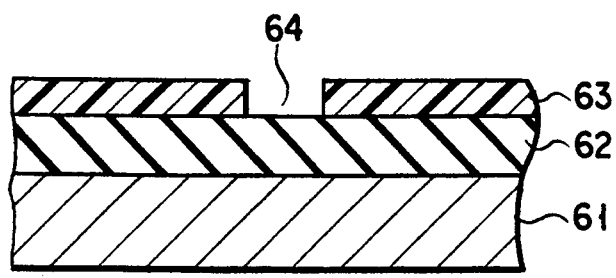
FIGS. 5A and 5B are cross sectional views for exemplifying etching steps of a semiconductor wafer in the method of the present invention.

The dry etching method of the present invention can be applied to various elements to achieve various etching patterns, as exemplified in FIGS. 5A to 7B. Specifically, FIGS. 5A and 5B show that an oxide film, e.g., a $SiO_2$ film 62, is formed on the surface of a semiconductor substrate, e.g., a Si substrate 61. Also, a photoresist layer 63 is formed on the $SiO_2$ film 62. As shown in FIG. 5A, the photoresist layer 63 is subjected to a photoetching treatment to form a mask with an opening 64 provided between the masked regions, said opening selectively exposing the $SiO_2$ film 62. The exposed portion of the $SiO_2$ film is etched to form an etching hole 65 as shown in FIG. 5B.

Figure 6A:
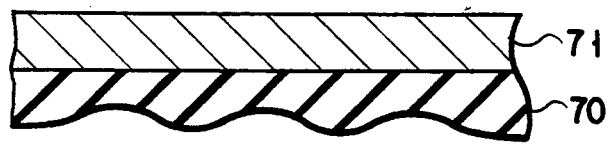
FIGS. 6A to 6D are cross sectional views collectively exemplifying other etching steps in the method of the present invention.
Figure 6B:
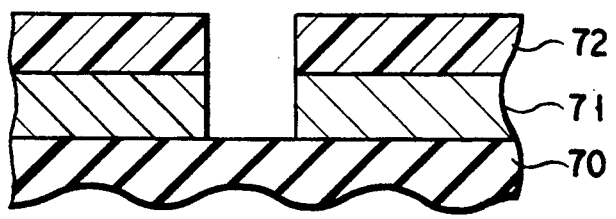
Figure 6C:
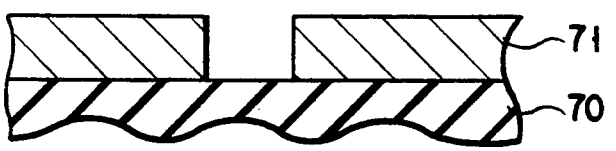
Figure 6D:
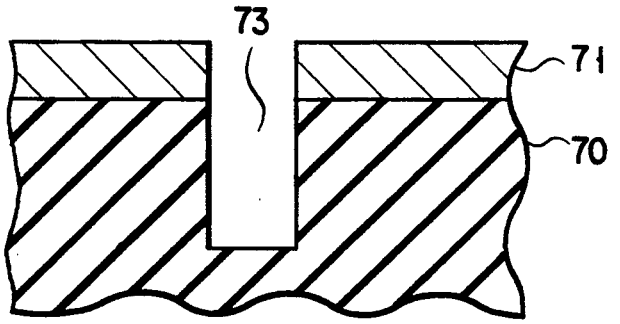

FIGS. 6A to 6D collectively covers a case where the dry etching method of the present invention is applied to an element in which a semiconductor film is formed on an oxide or nitride substrate. As shown in FIG. 6A, a poly-Si film 71 is formed first on a $SiO_2$ substrate 70. Then, a resist film 72 is formed on the poly-Si film 71, followed by etching the poly-Si film, as shown in FIG. 6B. Further, the resist film 72 is removed as shown in FIG. 6C. The etching method of the present invention is applied to a workpiece thus prepared so as to form an etching hole 73 of a high etching verticality in the $SiO_2$ substrate 70, as shown in FIG. 6D.

Figure 7A:
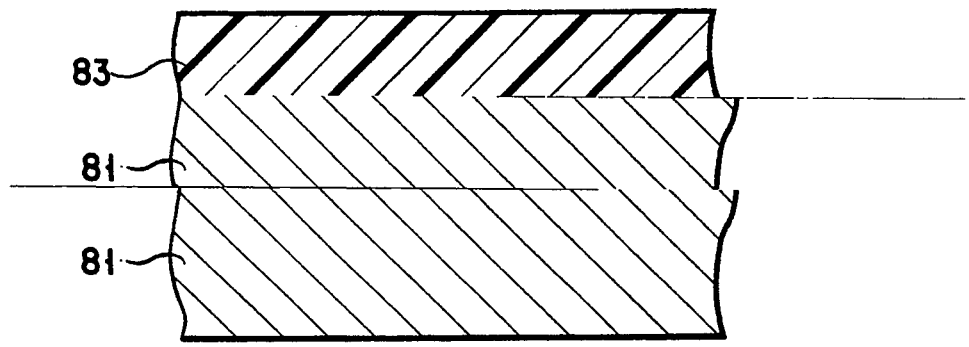
FIGS. 7A and 7B are cross sectional views collectively exemplifying other etching steps in the method of the present invention.
Figure 7B:
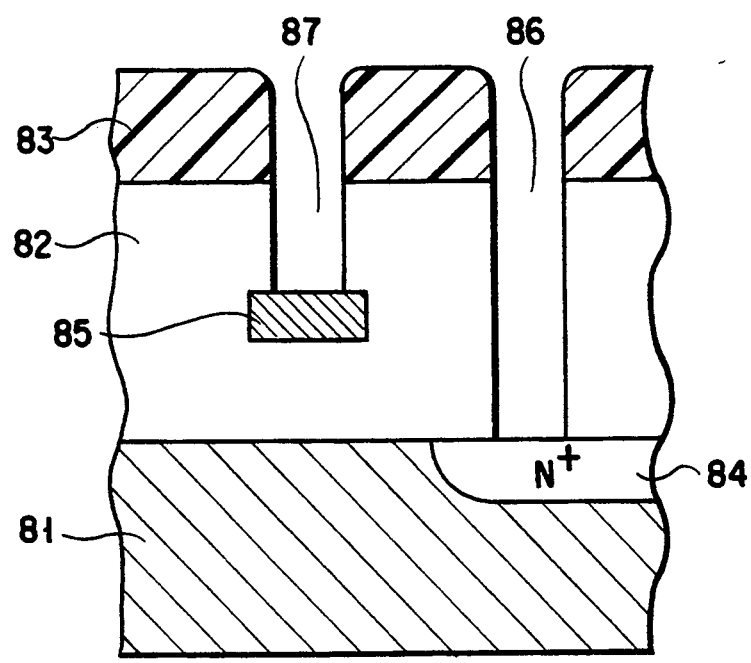

FIGS. 7A and 7B cover a case where an element comprises a Si substrate 81, a $SiO_2$ layer 82 formed on the substrate 81, a photoresist layer 83 formed on the $SiO_2$ layer 82, a diffusion layer 84 formed within the substrate, and a poly-Si wiring 85 formed within the $SiO_2$ layer 82. The etching method of the present invention can be applied to the element of the particular construction to form a contact hole 86 leading to the diffusion layer 84 and another contact hole 87 leading to the poly-Si wiring 85, as shown in FIG. 7B. In this case, the $SiO_2$ layer 82 can be etched with a high etching rate while suppressing the etching rate of the poly-Si wiring 85 by setting the etching selectivity of the $SiO_2$ layer 82 to the poly-Si wiring 85 at a high level.

In the embodiments described above, a silicon single crystal or $SiO_2$ is used as a substrate of the workpiece. However, the etching method of the present invention can also be applied to a workpiece comprising a substrate formed of another material such as poly-Si, WSi, MoSi, or TiSi.

A prominent effect of an etching gas of the present invention obtained by performing the abovedescribed magnetron RIE-etching will be described below.

Figure 5B:
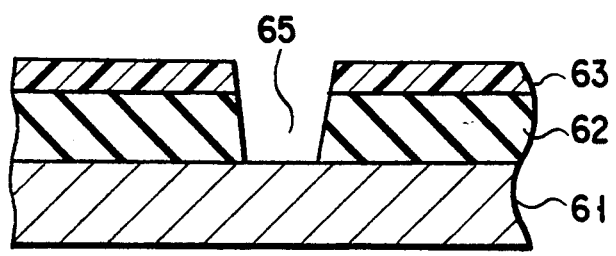

Using the apparatus shown in FIG. 1, the susceptor 4 having a diameter of 180 mm was used, a silicon wafer having the arrangement shown in FIG. 5B was placed on the susceptor 4 as the object 3. $CHF_3$ gas which is a Freon gas and CO gas were supplied in the space 36. A gas mixture obtained by mixing these gases was diffused near the surface of the silicon wafer through the diffusion holes 37, and a pressure in the processing vessel 1 was set to be 40 m Torr. While a magnetic field of 120 G was applied from the magnet 52, an RF power of 600 W was supplied from the RF power apply 9 to generate a magnetron discharge. At this time, an etching process was performed by a plasma generated by the magnetron discharge.

Figure 8:
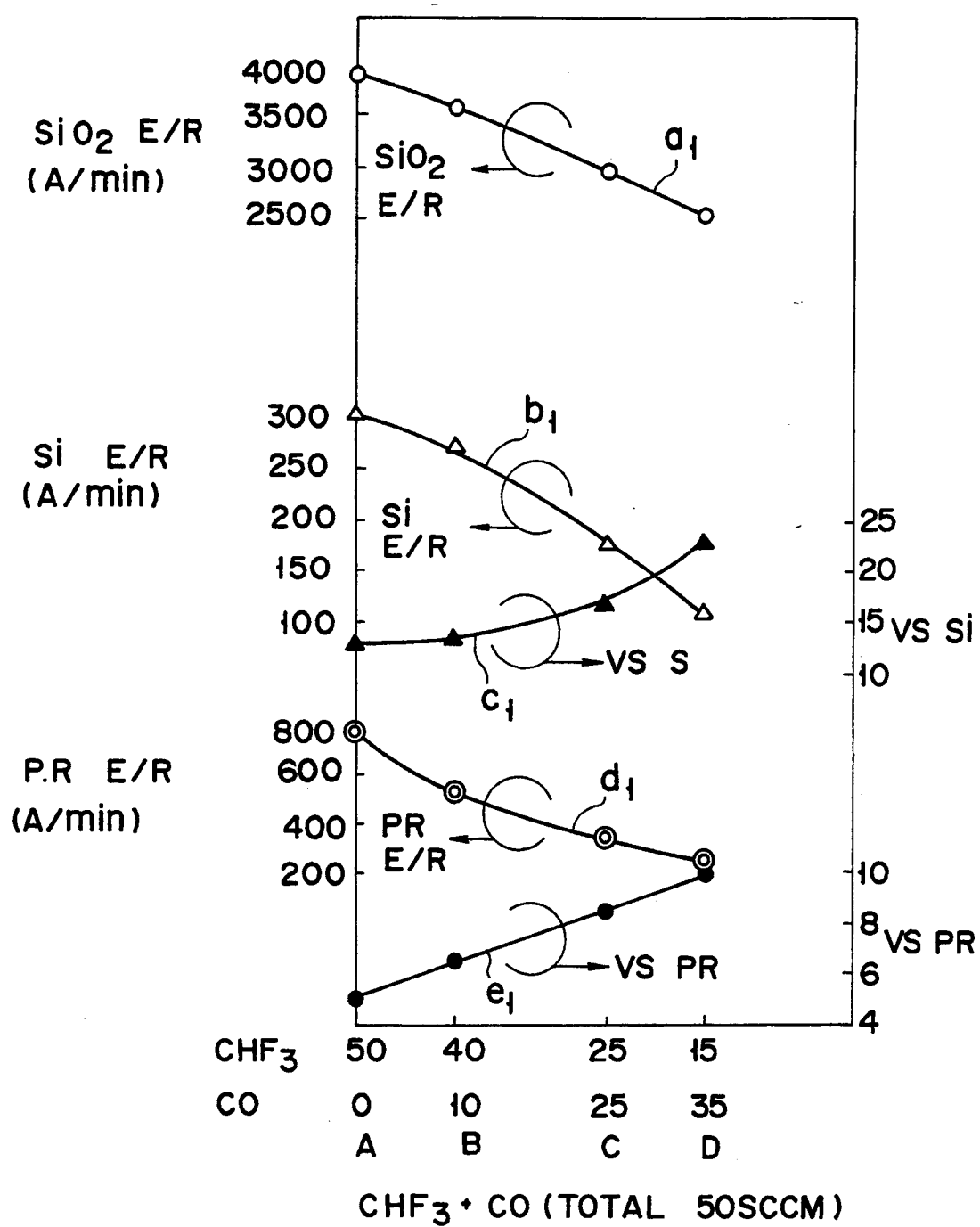
FIG. 8 is a graph showing the relationships between the flow rate ratio of $CHF_3$ to CO and the etching rate of each of thin film layers and between the flow rate ratio of $CHF_3$ to CO and the etching selectivity of a silicon dioxide pattern layer with respect to silicon substrate and resist layer, covering the case where a dry etching is applied to a silicon wafer by using the apparatus shown in FIG. 1, in which the flow rate ratio of $CHF_3$ to CO is changed while keeping constant the sum of the $CHF_3$ flow rate and the CO flow rate.

FIG. 8 shows an etching rate (graph $a_1$) of the $SiO_2$ film, an etching rate (graph $b_1$) of the Si substrate 21, a selection ratio (graph $c_1$) of the $SiO_2$ film 22 to the substrate 21, an etching rate (graph $d_1$) of the resist 23 (P, R), and a selection ratio (graph $e_1$) of the $SiO_2$ film to the resist 23, when a supply ratio of $CHF_3$ gas to CO gas is varied (points A, B, C, and D).

Å/min is the unit for these etching rates. When a total supply rate is set to be 50 sccm, the supply ratio of the $CHF_3$ gas to the CO gas is set at 50:0 (indicated by point A), 40:10 (indicated by point B), 25:25 (indicated by point C), and 15:35 (indicated by point D). The etching rates and the selection ratios are plotted in correspondence with the above supply ratios.

The most important factor in an etching process is a high selection ratio of the $SiO_2$ pattern layer 62 to the Si substrate 61. As is apparent from FIG. 8, when conventional RIE is performed by supplying only $CHF_3$ gas, a selection ratio of the $SiO_2$ pattern layer to a Si substrate is 12.8 (point A in graph $C_1$). In contrast to this, it is apparent that selection ratios are increased at points B, C, and D where values obtained when CO gas is supplied are plotted. Especially, it is understood that considerably high selection ratios of the $SiO_2$ pattern layer to the Si substrate, i.e., 16.7 and 22.9, can be respectively obtained at points C and D where values obtained when a CO gas supply rate is higher than a $CHF_3$ gas supply rate (a supply ratio of CO gas to $CHF_3$ gas is a ratio of 1:1 or more) are plotted.

A selection ratio (graph $e_1$) of the $SiO_2$ pattern layer to a resist layer (for example, borac photoresist) is linearly increased in proportion to the content of added CO gas. It is apparent that the value of point D is almost twice the value of point A at which CO gas addition is not performed.

As apparent from FIG. 8, the etching rate (graph $a_1$) of the $SiO_2$ pattern layer, the etching rate (graph $b_1$) of the Si substrate, and the etching rate (graph $d_1$) of the resist layer are linearly decreased in proportion to an increase in adding rate of CO gas.

The plotted values of the graphs ($a_1$, $c_1$, $d_1$, and $e_1$) except for graph $b_1$ in points A to D are shown in columns A to D of measurement values in FIG. 11 (to be described later).

FIG. 9 is a graph showing a result obtained by examining a microloading effect using a ratio of a $CHF_3$ flow rate to a CO gas flow rate as a parameter. In this experiment, the microloading effect means a decrease in value of $$\frac{\text{etching rate of each contact hole}}{\text{etching rate of scribing line}} \times 100(\%)$$

in accordance with a decrease in contact hole diameter.

The abscissa in FIG. 9 shows an etching rate of $SiO_2$ of a contact hole standardized by an etching rate of $SiO_2$ of a scribing pattern portion having a width of 100 μm. The ordinate shows the size of the contact hole.

When $CHF_3$:CO is 50 sccm:0 sccm. the etching rate is decreased to 70% when a 0.8-μm pattern is used, and the etching rate is decreased to 40% when a 0.6-μm is used. In contrast to this, when $CHF_3$:CO is 25 sccm:25 sccm, the etching rate is increased to 90% when the 0.8-μm pattern is used, and the etching rate is increased to 80% when the 0.6 μm is used. In addition, when $CHF_3$:CO is 15 sccm:35 sccm, the etching rate is not dependent on a pattern size. Therefore, it is confirmed that the microloading effect disappears.

FIG. 10 shows an etching rate (graph $a_2$) of a $SiO_2$ pattern layer, uniformity (graph f: indicated by percentage) of the etching rate of the $SiO_2$ pattern layer, an etching rate (graph $b_2$) of an Si substrate, a selection ratio (graph $c_2$) of the $SiO_2$ pattern layer to the Si substrate, an etching rate (graph $d_2$) of a resist layer, and a selection ratio (graph $e_2$) of the $SiO_2$ pattern layer to the resist layer, when a $CHF_3$ flow rate is set to be constant (90 sccm) and a CO flow rate is set at 90 sccm (indicated by point E), 180 sccm (indicated by point F), and 270 sccm (indicated by point G).

The state of each graph in FIG. 10 is similar to the state of each graph in FIG. 8. When a CO flow rate is increased with respect to a $CHF_3$ flow rate, although the etching rate (graph $a_2$) of the $SiO_2$ layer, the etching rate (graph $b_2$) of the Si substrate, and the etching rate (graph $d_2$) of the resist layer are almost linearly decreased, the selection ratio (graph $c_2$) of the pattern layer to the Si substrate, and a selection ratio (graph $e_2$) of the $SiO_2$ layer to the resist layer are linearly increased. Especially in graph $c_2$, although the value of the selection ratio is 12.8 (measurement value at point A in FIG. 4) when only $CHF_3$ gas is supplied, when CO gas is supplied at the same flow rate as that of $CHF_3$ gas, the selection ratio becomes 20. In addition, when CO gas is supplied at a flow rate two or three times of that of $CHF_3$ gas, the selection ratio is further increased. As a result, it is confirmed that CO gas is preferably supplied at a flow rate not less than the flow rate of $CHF_3$ gas (ratio of 1:1 or more). As is apparent from graph f, even when a flow rate of CO gas is increased, the uniformity of the etching rate of the $SiO_2$ layer is not changed.

When silicate glass containing boron and phosphorus was etched under an etching condition of point F in FIG. 10 an etching rate of 4,400 Å/min could be obtained, and a selection ratio of the silicate glass to an Si substrate reached 57.

FIG. 7 shows measurement values of each gas ratio (points A to D) in FIG. 4 and etching conditions when a contact diameter (μm) is changed into three values, i.e., 1.2. 0.8, and 0.6 at each gas ratio. As is apparent from FIG. 7, when CO gas is supplied, even when the contact diameter is decreased, an etching depth is not changed, and a microloading effect, i.e., an effect for decreasing an etching depth in proportion to an decrease in an etching diameter, can be largely suppressed.

In this etching process, as described above, it is deduced that $CF_2$ radicals produced by decomposing $CHF_3$ molecules in a plasma and CO molecules are reacted with each other in the following reaction formula:

$$CF_2 + CO \rightarrow COF_2 + C$$

It is understood to reduce $CF_{2O}$ radicals which are polymerized to each other to form a fluorocarbon polymer. Therefore, deposition of the polymer formed as described above on the bottoms or side walls of small holes can be suppressed, verticality of etching can be improved, and a microloading effect can be suppressed.

Carbon (C) generated by the above reaction forms a C film 25 on the surface of the Si substrate exposed by etching as shown in FIG. 5B. The surface of the Si substrate is protected by the C film, and etching of the Si substrate is suppressed. On the $SiO_2$ film, since CO or $CO_2$ is generated by bonding oxygen to carbon generated by an etching reaction of $SiO_2$, deposition of carbon is suppressed, and etching is rapidly performed. As a result, a selection ratio of the $SiO_2$ film to the Si substrate is increased.

FIG. 12 shows etching taper angles (slope of a side wall of an etching groove portion: $\theta$ in FIG. 8) in points A to D in FIG. 11. In FIG. 12, when a contact diameter is set to be 0.6, 0.8, and 1.2 μm, taper angles in points B to D are shown in graphs $t_1$, $t_2$, and $t_3$, respectively. According to the graphs, it is understood that the taper angles are increased in proportion to an increase in CO flow rate. As is apparent from FIG. 8, especially when a CO flow rate is set to be a $CHF_3$ flow rate or more' a taper angle is largely increased, and verticality (anisotropy) of a hole formed by an etching process is improved.

Figure 13:
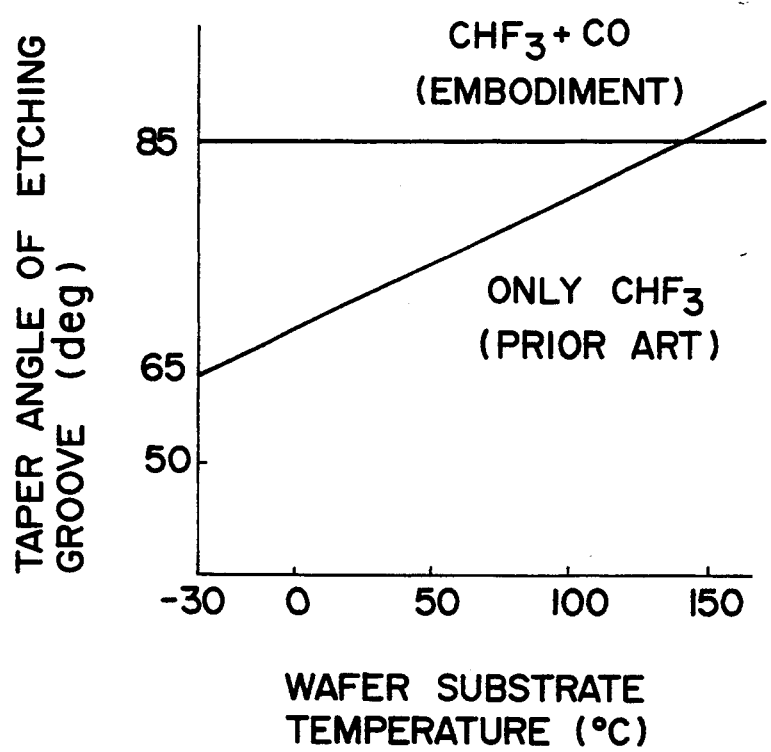
FIG. 13 a graph showing the taper angle of the etching groove relative to the wafer temperature in the method of the present invention.

FIG. 13 is a change in taper angle $\theta$ of an etching groove when the temperature of the wafer shown in FIG. 5B is changed within a range from −30° C. to 150° C. As is apparent from FIG. 9, when $CHF_3 + CO$ (gas ratio: D; contact diameter: 0.6 μm) are supplied according to the embodiment of the present invention, even when the wafer temperature is changed, a taper angle $\theta$ representing an almost vertical wall can be stably obtained. In contrast to this, when only $CHF_3$ (contact diameter: 0.6 μm) is supplied according to a conventional technique, a taper angle $\theta$ is largely changed depending on the wafer temperature.

As described above, verticality of an etching groove is improved according to the method of the present invention. This improvement is achieved by an effect of a gas containing C having an oxidation number of less than 4 and O.

The C film formed in this embodiment must be removed after the etching process. The C film may be removed by any of methods the C film can be simultaneously removed by an ashing step for removing the resist layer 23 shown in FIG. 2A.

The effect of the temperature of the workpiece will be described using the experimental data. In this experiment, which was conducted by using a magnetron plasma etching apparatus as shown in FIG. 1, a $CHF_3$ gas was used a first gas containing a halogen element, with a CO gas used as a second gas containing C having an oxidation number of less than 4 and O. The wafer temperature, which was measured by fluorescent fiber thermometer, was set at various levels, as seen from FIG. 14. Table 1 shows the etching conditions employed in this experiment:

TABLE 1

| Etching gas pressure: | 40 mtorr |
| --- | --- |
| $CHF_3$/CO flow rate ratio: | 45 SCCM/155 SCCM |
| RF power: | 600 W |
| Cooling gas: | He (10 Torr) |
| Wafer size: | φ 150 mm |

Figure 14:
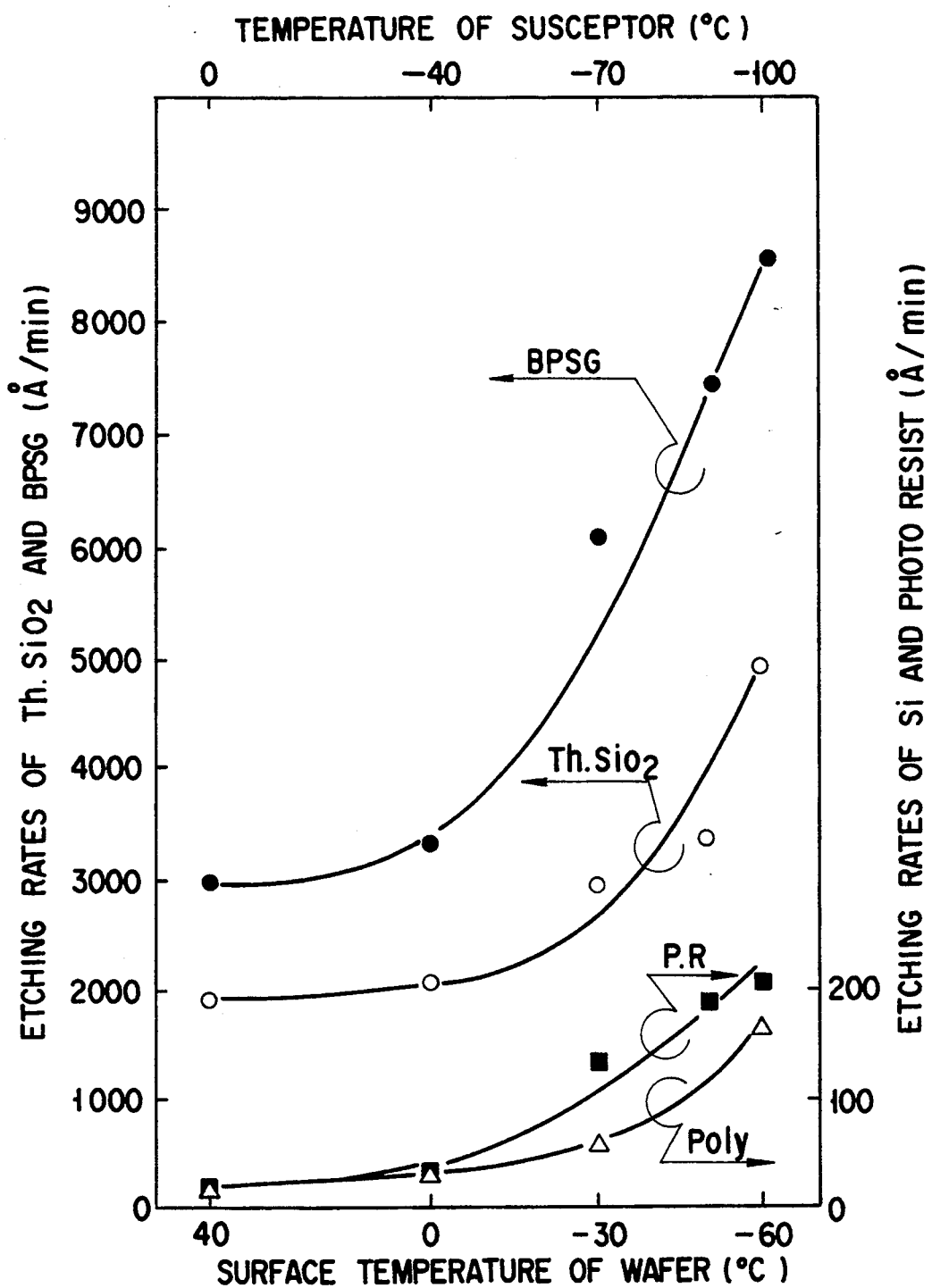
FIG. 14 is a graph showing the relationship between the wafer temperature and the etching rate.

FIG. 14 is a graph showing how the etching rates of BPSG ($SiO_2$ doped with P and B), $SiO_2$, poly-Si and photoresist included in the wafer were affected by the wafer temperature. In the graph of FIG. 14, the etching rate is plotted on the ordinate, with the surface temperature of the wafer plotted on the abscissa.

As apparent from FIG. 14, the etching rate of $SiO_2$ can be prominently increased by setting the temperature of the wafer surface at a level not higher than 0° C. Under the particular temperature region, the etching rates of poly-Si and photoresist can also be increased. However, the degree of increase in the etching rate of $SiO_2$ is markedly higher than that of any of poly-Si and photoresist. In other words, a sufficiently high etching selectivity of $SiO_2$ can be obtained under temperatures not higher than 0° C. For example, the selectivity achieved in the conventional method is at most 13, as described previously. In the present invention, however, the selectivity at −50° C. is as large as about 45, as seen from FIG. 14.

An excellent result was obtained in this experiment in terms of the etching anisotropy, too. Further, a micro loading effect was scarcely recognized.

Figure 15:
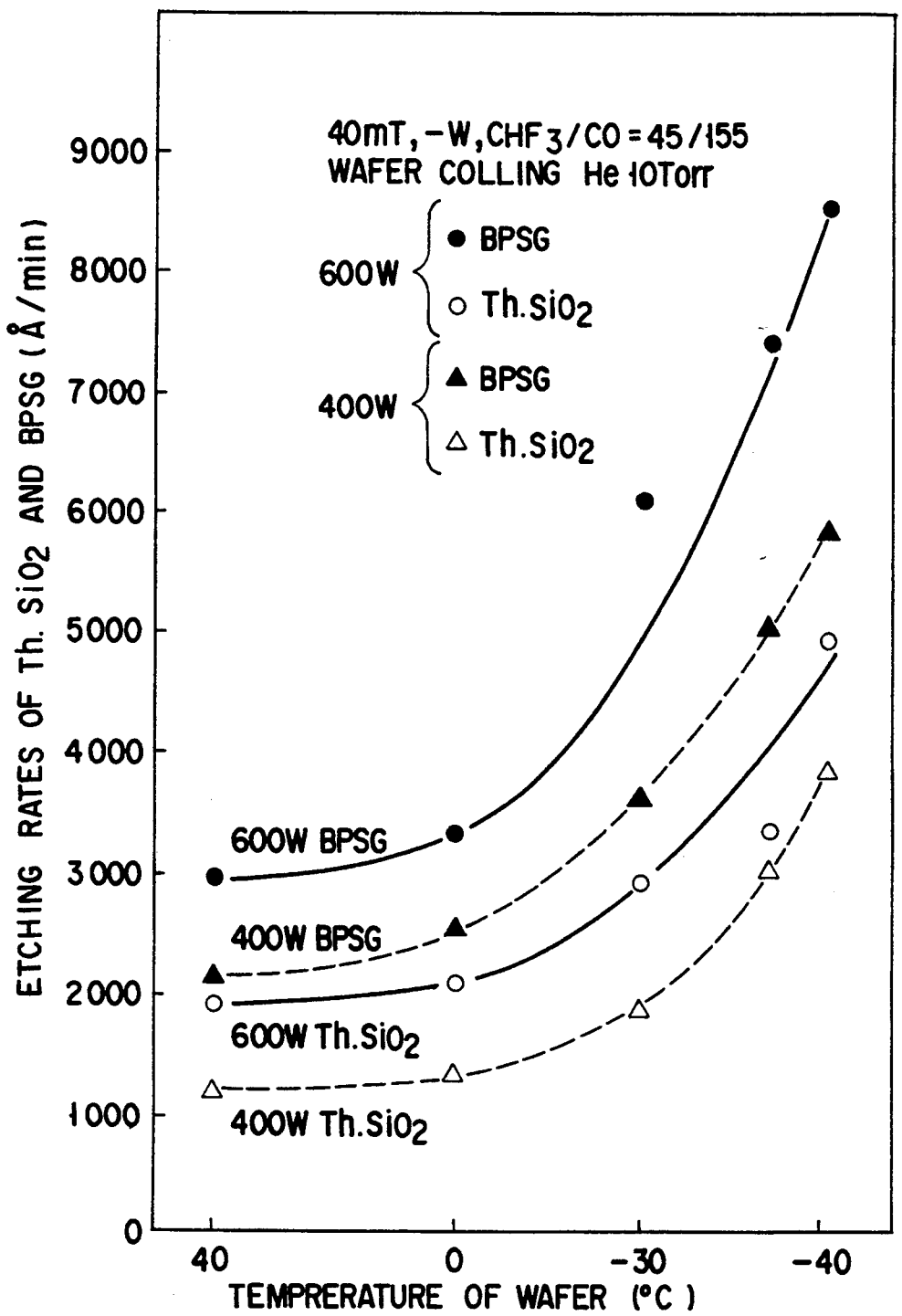
FIG. 15 is a graph showing the relationship between the wafer temperature and the etching rate in the case of changing the RF power.

An additional experiment was conducted by setting the RF power at 400 W or 600 W, with the results as shown in a graph of FIG. 15. As apparent from the experimental data given in FIG. 15, the etching rate can be further increased by increasing the RF power.

An additional experiment was conducted by using an apparatus prepared by using the gas supply system shown in FIG. 6 in the apparatus shown in FIG. 2. In this experiment, a coolant was circulated through the coolant passageway 131 to cool the lower electrode to a temperature of −10° C., and a semiconductor wafer having a diameter of 6 inches was disposed on the lower electrode. The pressure within the vacuum chamber was maintained at 0.5 Torr. While supplying an etching gas at a predetermined flow rate, an RF power of 380 kHz and 800 W was supplied from the RF power source. The flow rates of the Ar gas, $CHF_3$ gas and $CF_4$ gas were fixed at 1000 SCCM, 20 SCCM and 20 SCCM, respectively. On the other hand, the CO gas flow rate was set at 0 SCCM, 50 SCCM (25 SCCM from each of the two CO gas supply sections), and 200 SCCM (100 SCCM from each of the CO gas supply sections). Table 2 shows the etching selectivity ($SiO_2$ etching rate/Si etching rate) obtained in this experiment:

TABLE 2

| CO gas (SCCM) | Selectivity |
| --- | --- |
| 0 | 18.2 |
| 50 | 20.7 |
| 200 | 29.1 |

Table 2 clearly shows the effect produced by the CO gas addition.

A still additional experiment was conducted by setting the CO flow rate at 200 SCCM. In this experiment, the etching gas was uniformly supplied to the wafer. In other words, the amount of the CO gas supplied to the peripheral portion of the wafer was not set larger than that supplied to the central portion. The etching selectivity was found to be 19.1, which was lower than in the case where the amount of the CO gas supplied to the peripheral portion was larger than that supplied to the central portion. Clearly, it is desirable to supply the CO gas to the peripheral portion in a larger amount.

The etching method of the present invention can be performed under various conditions in addition to the conditions employed in the embodiments described above. For example, in the case of using the magnetron plasma etching apparatus shown in FIG. 1, the pressure within the treating vessel should desirably be set to fall within a range of between 5 mTorr and 300 mTorr. Also, the power supply, which is determined in accordance with the size of the susceptor, should be set to fall within a range of between 200 W and 1500 W. Further, the magnet should be designed to produce a magnetic field of about 30 G to 300 G.

Various conditions can also be employed in the cases of an ECR etching and a RIE etching, which do not use a magnet. Further, any type of apparatus can be used for working the method of the present invention as far as the apparatus is adapted for carrying out a dry etching treatment.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A dry etching method, comprising the steps of:
   placing a workpiece having an oxide portion or a nitride portion and structurally having a central portion and a peripheral portion about the central portion in a processing vessel;
   keeping said workpiece at a temperature not higher than 0° C. within the processing vessel;
   supplying an etching gas including a first gas containing a halogen element and a second gas containing carbon having an oxidation number of less than 4 and oxygen to a region in the vicinity of the workpiece while keeping the temperature of the workpiece at a level not higher than 0° C.; and
   forming a plasma of said etching gas for etching the oxide portion or the nitride portion of the workpiece with the plasma, wherein the amount of the second gas supplied to the peripheral portion of the workpiece is larger than the amount supplied to the central portion.

2. The dry etching method according to claim 1, wherein said second gas contains carbon monoxide (CO).

3. The dry etching method according to claim 1, wherein said second gas is constituted of at least one compound selected from the group consisting of HCOOH, HCHO, CH$_3$COOH and CH$_3$OH.

4. The dry etching method according to claim 1, wherein said first gas contains a fluorine-containing compound.

5. The dry etching method according to claim 4, wherein said first gas contains at least one fluorocarbon compound.

6. The dry etching method according to claim 5, wherein said first gas is CHF$_3$.

7. The dry etching method according to claim 6, wherein said second gas contains carbon monoxide (CO).

8. The dry etching method according to claim 7, wherein the amount of the CO gas supplied is greater than the amount of the CHF$_3$ gas supplied.

9. The dry etching method according to claim 1, wherein said etching method is conducted by the formation of a magnetron discharge.

10. The dry etching method according to claim 1, wherein said etching step is conducted by forming a plasma between a pair of electrodes arranged in parallel.

* * * * *